(12) United States Patent
Zeng et al.

(10) Patent No.: US 12,406,719 B2
(45) Date of Patent: Sep. 2, 2025

(54) STORAGE AND ACCESSING METHODS FOR PARAMETERS IN STREAMING AI ACCELERATOR CHIP

(71) Applicant: Shenzhen Corerain Technologies Co., Ltd., Guangdong (CN)

(72) Inventors: Chenglong Zeng, Guangdong (CN); Kuen Hung Tsoi, Guangdong (CN); Xinyu Niu, Guangdong (CN)

(73) Assignee: Shenzhen Corerain Technologies Co., Ltd., Shenzhen (CN)

( * ) Notice: Subject to any disclaimer, the term of this patent is extended or adjusted under 35 U.S.C. 154(b) by 242 days.

(21) Appl. No.: 18/184,686

(22) Filed: Mar. 16, 2023

(65) Prior Publication Data

US 2023/0307036 A1    Sep. 28, 2023

(30) Foreign Application Priority Data

Mar. 24, 2022 (CN) .......................... 202210294078.3

(51) Int. Cl.
*G11C 11/4093* (2006.01)
*G11C 11/4096* (2006.01)
*G11C 11/54* (2006.01)

(52) U.S. Cl.
CPC ...... *G11C 11/4093* (2013.01); *G11C 11/4096* (2013.01); *G11C 11/54* (2013.01)

(58) Field of Classification Search
CPC .................................................. G11C 11/4093
See application file for complete search history.

(56) References Cited

U.S. PATENT DOCUMENTS

| | | | |
|---|---|---|---|
| 10,109,340 B2 * | 10/2018 | Bains .................. | G11C 11/4087 |
| 10,872,038 B1 * | 12/2020 | Nair ........................ | G06F 17/16 |
| 2009/0259895 A1 * | 10/2009 | Jung ...................... | G11C 29/28 |
| | | | 714/718 |
| 2012/0254528 A1 * | 10/2012 | Na ....................... | G06F 12/0607 |
| | | | 711/E12.001 |
| 2014/0133247 A1 * | 5/2014 | Ku .......................... | G11C 7/106 |
| | | | 365/189.05 |
| 2022/0100414 A1 * | 3/2022 | Li .......................... | G06F 3/0604 |

* cited by examiner

*Primary Examiner* — Douglas King (57) ABSTRACT

The present disclosure provides storage and accessing methods for parameters in a streaming AI accelerator chip, and relates to the technical field of artificial intelligence, wherein the streaming-based data buffer comprises: a plurality of banks, different banks being configured to store different data; a data read circuit configured to receive a read control signal and a read address corresponding to a computation task, in the case the read control signal corresponds to a first read mode, determine n banks from the plurality of banks based on the read control signal, and read first data required for performing the computation task in parallel from the n banks based on the read address, the first data comprising n pieces of data corresponding to the n banks in a one-to-one correspondence, n≥2, n being a positive integer.

10 Claims, 8 Drawing Sheets

| 1 | 2 | 3 |
|---|---|---|
| 4 | 5 | 6 |
| 7 | 8 | 9 |

The 1st 3 x 3 matrix

| 1 | 2 | 3 |
|---|---|---|
| 4 | 5 | 6 |
| 7 | 8 | 9 |

The 2nd 3 x 3 matrix

| 1 | 2 | 3 |
|---|---|---|
| 4 | 5 | 6 |
| 7 | 8 | 9 |

The 3rd 3 x 3 matrix

| adddr1 |
|---|
| adddr2 |
| adddr3 |
| adddr4 |
| ⋮ |
| adddrk |

First bank 11

STORAGE AND ACCESSING METHODS FOR PARAMETERS IN STREAMING AI ACCELERATOR CHIP

CROSS REFERENCE TO RELATED APPLICATIONS

The present application claims the benefit of Chinese Patent Application No. 202210294078.3 filed on Mar. 24, 2022, the contents of which are incorporated herein by reference in their entirety.

TECHNICAL FIELD

The present disclosure relates to the technical field of artificial intelligence, and more particularly, to storage and accessing methods for parameters in a streaming AI accelerator chip.

BACKGROUND

With the development of artificial intelligence technology, various artificial intelligence algorithms have been widely used in various industries. One of the salient features of artificial intelligence algorithms is the need to use a large number of computational resources to perform massive computations on a large number of input data to obtain a final result, however, the premise for performing these computations is that the memory storing the data required for the computations can continuously output a large amount of data to the computation circuitry for the computations.

In the related art, a data buffer based on an instruction set is generally used to store and output a large amount of data required for performing a calculation.

SUMMARY

The inventors have noted that in the related art, data processing is inefficient.

Upon analysis, the inventors have found that such an instruction set based data buffer can only read one piece of data based on one read instruction, and therefore, in the case where the data required for performing a computation task is a plurality of different pieces of data, the instruction set based data buffer can only read one piece of data based on the current instruction before reading the next piece of data based on the next instruction. This serial data read mode results in less efficient data processing.

In order to solve the above problems, the embodiments of the present disclosure propose the following solutions.

According to an aspect of an embodiment of the present disclosure, there is provided a streaming-based data buffer comprising: a plurality of banks, different banks being configured to store different data; a data read circuit configured to receive a read control signal and a read address corresponding to a computation task, in the case the read control signal corresponds to a first read mode, determine n banks from the plurality of banks based on the read control signal, and read first data required for performing the computation task in parallel from the n banks based on the read address, the first data comprising n pieces of data corresponding to the n banks in a one-to-one correspondence, n≥2, n being a positive integer.

In some embodiments, the read address comprises an addressing address and a chip select address, the data read circuit configured to read the first data based on the addressing address.

In some embodiments, the data read circuit is further configured to, in the case the read control signal corresponds to a second read mode, determine one bank from the plurality of banks based on the chip select address and read a second data required for performing the computation task from the one bank based on the addressing address.

In some embodiments, the read control signal corresponds to the first read mode in the case the computation task is a convolution.

In some embodiments, in the case the computation task is a standard convolution in a neural network algorithm, each piece of data comprises part of the data in one convolution kernel.

In some embodiments, in the case the computation task is a depth separable convolution in a neural network algorithm, each piece of data comprises a part of data in a feature map of one channel.

In some embodiments, the read control signal corresponds to the second read mode in the case the computation task is a bilinear interpolation in a neural network algorithm.

In some embodiments, the data buffer further comprises a data write circuit configured to receive a write control signal and a write address corresponding to the computation task, determine the n banks based on the write control signal and write the first data in parallel to the n banks based on the write address in the case the write control signal corresponds to a first write mode.

According to another aspect of an embodiment of the present disclosure, there is provided another streaming-based data buffer comprising: a plurality of banks, different banks being configured to store different data; a data write circuit configured to receive a write control signal and a write address corresponding to a computation task, in the case where the write control signal corresponds to a first write mode, determine n banks from the plurality of banks based on the write control signal, and write first data required for performing the computation task in parallel to the n banks based on the write address, the first data comprising n pieces of data corresponding to the n banks in a one-to-one correspondence, n≥2, n being a positive integer.

In some embodiments, the write address comprises an addressing address and a chip select address, the data write circuit is configured to write the first data based on the addressing address.

In some embodiments, the data write circuit is further configured to, in the case the write control signal corresponds to a second write mode, determine one bank from the plurality of banks based on the chip select address and write a second data required for performing the computation task to the one bank based on the addressing address.

In some embodiments, the write control signal corresponds to the first write mode in the case the computation task is a convolution.

In some embodiments, the write control signal corresponds to the second write mode in the case the computation task is a bilinear interpolation in a neural network algorithm.

According to yet another aspect of an embodiment of the present disclosure, there is provided an artificial intelligence chip comprising: a streaming-based data buffer according to any one of the above-mentioned embodiments; an address generation unit configured to generate the read address and send the read address to the data buffer in response to a first drive signal corresponding to the computation task; and a control register configured to send the read control signal to the data buffer and send the first drive signal to the address generation unit in response to a first configuration signal corresponding to the computation task.

In some embodiments, the artificial intelligence chip further comprises: a processing circuit configured to send a plurality of ones of the n pieces of data to a calculation circuit in response to a second drive signal corresponding to the computation task sent by the control register.

In some embodiments, the data buffer further comprises a data write circuit configured to receive a write control signal and a write address corresponding to the computation task, determine the n banks based on the write control signal and write the first data in parallel to the n banks based on the write address in the case the write control signal corresponds to a first write mode; the address generation unit further configured to generate the write address and send the write address to the data buffer in response to a third drive signal corresponding to the computation task; the control register further configured to send the write control signal to the data buffer and send the third drive signal to the address generation unit in response to a second configuration signal corresponding to the computation task.

According to still another aspect of an embodiment of the present disclosure, there is provided another artificial intelligence chip comprising: a streaming-based data buffer according to any one of the above-mentioned embodiments; an address generation unit configured to generate the write address and send the write address to the data buffer in response to a third drive signal corresponding to the computation task; and a control register configured to send the write control signal to the data buffer and send the third drive signal to the address generation unit in response to a second configuration signal corresponding to the computation task.

In some embodiments, the artificial intelligence chip further comprises: a direct memory access module configured to obtain data required to perform the computation task from an off-chip memory in response to a fourth drive signal corresponding to the computation task sent by the control register; wherein the data write circuit is configured to obtain the first data from the required data and write the first data to the n banks in parallel.

According to still another aspect of an embodiment of the present disclosure, there is provided a streaming-based data processing method, comprising: receiving a read control signal and a read address corresponding to a computation task; in the case the read control signal corresponds to a first read mode, determine n banks from the plurality of banks based on the read control signal, and read first data required for performing the computation task in parallel from the n banks based on the read address, different data being stored in different banks of the plurality of banks, the first data comprising n pieces of data corresponding to the n banks in a one-to-one correspondence, n≥2, n being a positive integer.

In some embodiments, the read address comprises an addressing address and a chip select address, and the reading the first data required for performing the computation task from the n banks in parallel based on the read address comprises: reading the first data based on the addressing address.

In some embodiments, the method further comprises: in the case the read control signal corresponds to a second read mode, determining one bank from the plurality of banks based on the chip select address and read a second data required for performing the computation task from the one bank based on the addressing address.

In some embodiments, the method further comprises: receiving a write control signal and a write address corresponding to the computation task; determining the n banks based on the write control signal and write the first data in parallel to the n banks based on the write address in the case the write control signal corresponds to a first write mode.

According to still another aspect of an embodiment of the present disclosure, there is provided another streaming-based data processing method, comprising: receiving a write control signal and a write address corresponding to a computation task; in the case where the write control signal corresponds to a first write mode, determine n banks from a plurality of banks based on the write control signal, and write first data required for performing the computation task in parallel to the n banks based on the write address, different data being stored in different banks of the plurality of banks, the first data comprising n pieces of data corresponding to the n banks in a one-to-one correspondence, n≥2, n being a positive integer.

In some embodiments, the write address comprises an addressing address and a chip select address, and the writing the first data required for performing the computation task in parallel to the n banks based on the write address comprises: writing the first data based on the addressing address.

In some embodiments, the method further comprises: in the case the write control signal corresponds to a second write mode, determining one bank from the plurality of banks based on the chip select address and writing a second data required for performing the computation task to the one bank based on the addressing address.

According to still another aspect of an embodiment of the present disclosure, there is provided an accelerator comprising the artificial intelligence chip of any of the embodiments described above.

In embodiments of the present disclosure, a streaming-based data buffer may include a data read circuit and a plurality of banks, the data read circuit may read at least two pieces of data required for performing a computation task from at least two banks in parallel according to a received one read address. In this manner, the streaming-based data buffer can read a plurality of different pieces of data required for performing a computation task from a plurality of banks in parallel based on one read address, improving the efficiency of data reading and thus improving the efficiency of data processing.

The embodiments of the present disclosure are described in further detail below with reference to the accompanying drawings and examples.

BRIEF DESCRIPTION OF THE DRAWINGS

In order to more clearly illustrate of the present disclosure or the technical solutions in the prior art more clearly, a brief description will be given below with reference to the accompanying drawings which are used in the description of the embodiments or the prior art, and it is obvious that the drawings in the description below are only some embodiments of the present disclosure, and it would have been obvious for a person of ordinary skill in the art to obtain other drawings according to these drawings without involving any inventive effort.

DETAILED DESCRIPTION OF THE INVENTION

The embodiments of the present disclosure will now be described more fully hereinafter with reference to the accompanying drawings. Obviously, the embodiments described are only a few, but not all, embodiments of the present disclosure. Based on the embodiments of the present disclosure, all other embodiments obtained by a person of ordinary skill in the art without involving any inventive effort are within the scope of the present disclosure.

The relative arrangement of components and steps, numerical expressions, and numerical values set forth in these embodiments do not limit the scope of the present disclosure unless specifically stated otherwise.

Also, it is to be understood that the dimensions of the various components illustrated in the figures have not been drawn to scale for ease of description.

Techniques, methods, and devices known to one of ordinary skill in the relevant art may not be discussed in detail, but should be considered part of the written description where appropriate.

In all examples shown and discussed herein, any particular value should be interpreted as illustrative only and not as limiting. Thus, other examples of exemplary embodiments may have different values.

It should be noted that: like numbers and letters refer to like items in the following figures, and thus, once an item is defined in one figure, further discussion thereof is not required in subsequent figures.

Figure 1:
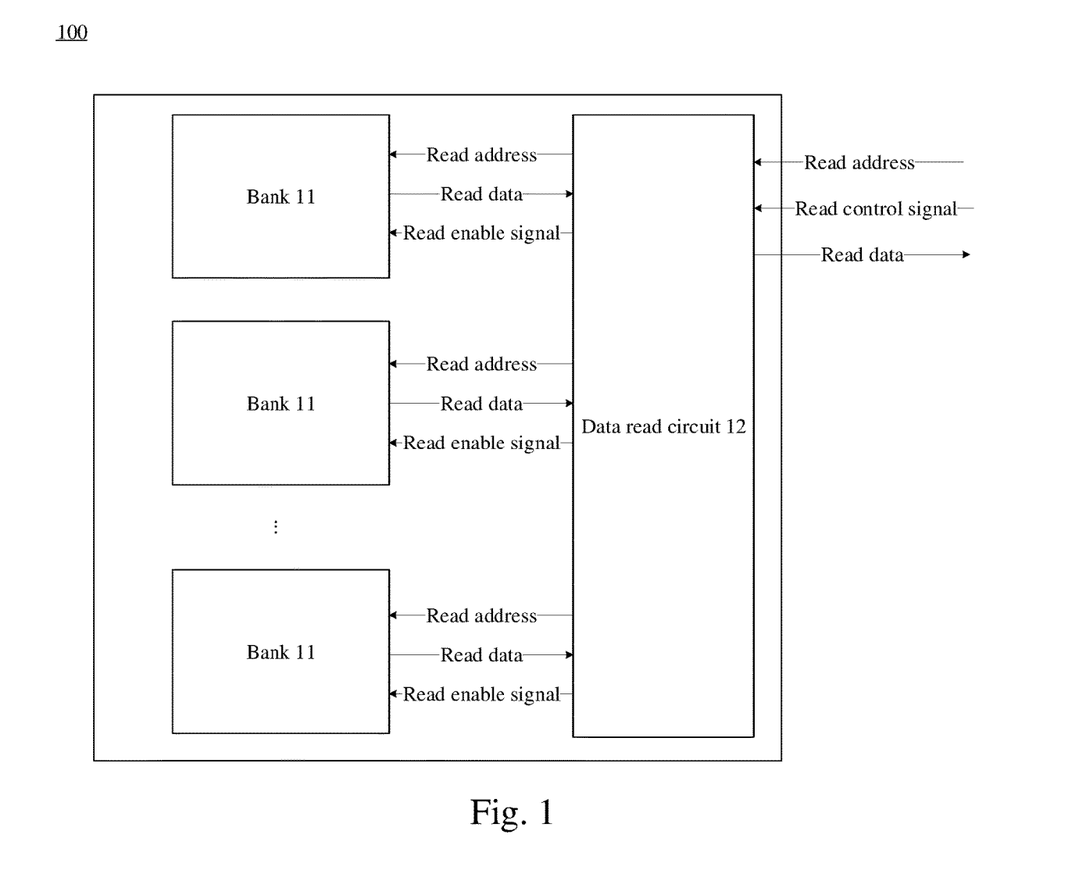
FIG. 1 is a schematic diagram of the structure of a streaming-based data buffer according to some embodiments of the present disclosure.

FIG. 1 is a schematic diagram of the structure of a streaming-based data buffer according to some embodiments of the present disclosure.

As shown in FIG. 1, a streaming-based data buffer (DB) 100 may include a plurality of banks 11 and a data read circuit 12.

Different banks 11 of the plurality of banks 11 may be configured to store different data.

a data read circuit 12 configured to receive a read control signal and a read address corresponding to a computation task, and configured to, in the case the read control signal corresponds to a first read mode, determine n banks 11 from the plurality of banks 11 based on the read control signal, and read first data required for performing the computation task in parallel from the n banks 11 based on the read address.

Here, the first data comprising n pieces of data corresponding to the n banks 11 in a one-to-one correspondence. n≥2, n is a positive integer. It should be understood that the n pieces of data may be different from each other.

It will also be appreciated that n is less than or equal to the number of banks 11. The value of n can be flexibly configured according to the amount of data required for performing a computation task.

In some embodiments, the read address received by data read circuit 12 may include an addressing address and a chip select address. For example, the chip select address may be the most significant bit of the read address, and the addressing address may consist of bits other than the most significant bit of the read address.

In the case where the read control signal corresponds to the first read mode, the data read circuit 12 may be configured to read the first data required for performing the computation task in parallel from the n banks 11 based on the addressing address.

For example, in the case the read control signal corresponds to the first read mode, the data read circuit 12 may generate n read enable signals and send the n read enable signals to the determined n banks 11 in a one-to-one correspondence. In the case where the n banks 11 are enabled to read, the data read circuit 12 may read the first data required for performing the computation task in parallel from the n banks 11 based on the addressing address in the read address.

It will be appreciated that one addressing address may correspond to a plurality of different banks 11. For example, the addressing addresses corresponding to storage spaces at the same location in a plurality of different banks 11 may be the same.

In some cases, the read control signals received by the data read circuit 12 may correspond to other read modes. The manner in which the data read circuit 12 reads data may be different in different read modes. This will be described in detail later.

In embodiments described above, a streaming-based data buffer may include a data read circuit and a plurality of banks, the data read circuit may read at least two pieces of data required for performing a computation task from at least two banks in parallel according to a received one read address. In this manner, the streaming-based data buffer can read a plurality of different pieces of data required for performing a computation task from a plurality of banks in parallel based on one read address, improving the efficiency of data reading and thus improving the efficiency of data processing.

In some embodiments, the data read circuit 12 is further configured to, in the case the read control signal corresponds to a second read mode, determine one bank 11 from the plurality of banks 11 based on the chip select address and read a second data required for performing the computation task from the one bank 11 based on the addressing address.

For example, in the case the read control signal corresponds to the second read mode, the data read circuit 12 may generate a read enable signal and send this read enable signal to the determined bank 11. In the case the bank 11 is enabled to read, the data read circuit 12 can read the second data required for performing the computation task on the basis of the addressing address in the read address.

In this manner, the streaming-based data buffer can support not only a read mode of reading a plurality of pieces of different data in parallel from a plurality of banks, but also a read mode of reading data from only one bank, improving the versatility of the streaming-based data buffer.

Figure 2:
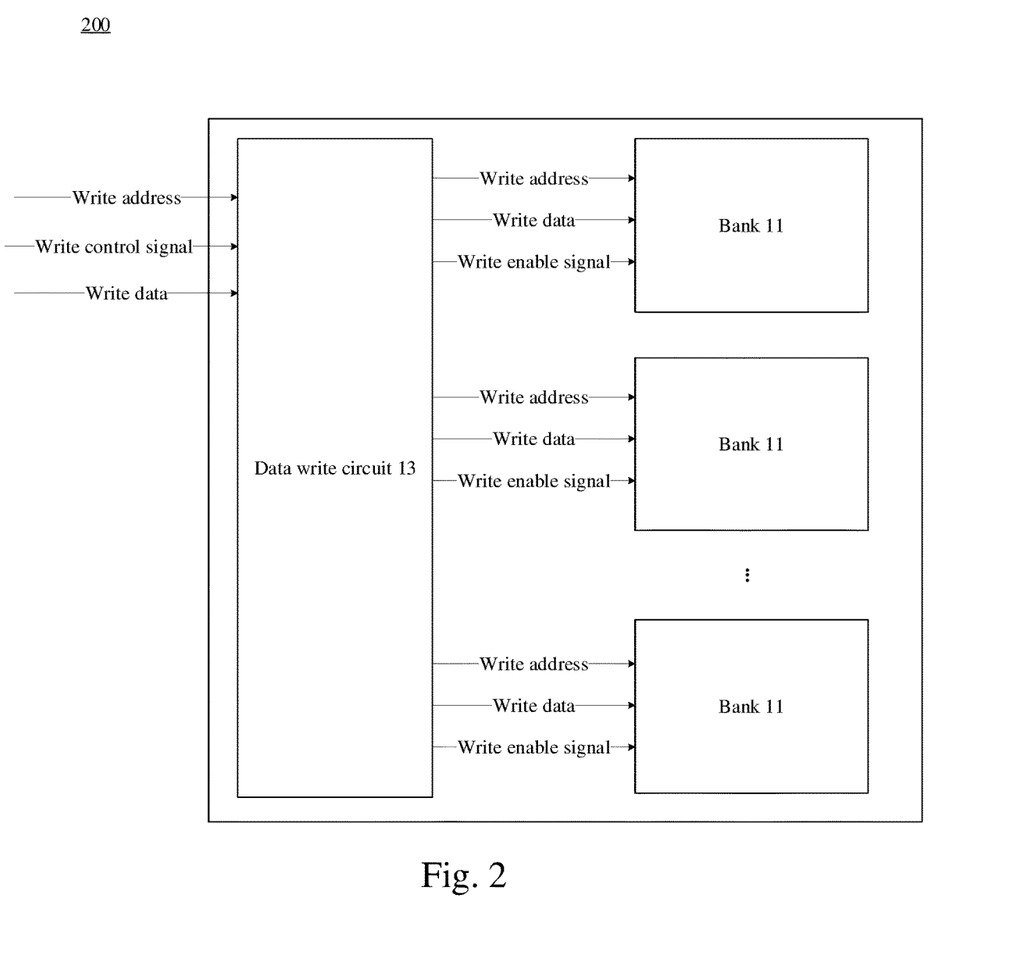
FIG. 2 is a schematic diagram of the structure of a streaming-based data buffer according to further embodiments of the present disclosure.

FIG. 2 is a schematic diagram of the structure of a streaming-based data buffer according to further embodiments of the present disclosure.

As shown in FIG. 2, the streaming-based data buffer 200 may include a plurality of banks 11 and a data write circuit 13.

Different banks 11 of the plurality of banks 11 may be configured to store different data.

The data write circuit 13 may be configured to receive a write control signal and a write address corresponding to the computation task, and may be configured to determine n banks 11 from the plurality of banks 11 based on the write control signal and write first data required for performing the computation task in parallel to the n banks 11 based on the write address in the case where the write control signal corresponds to the first write mode.

Here, the first data comprising n pieces of data corresponding to the n banks 11 in a one-to-one correspondence. n≥2, n is a positive integer. It should be understood that the n pieces of data may be different from each other.

It will also be appreciated that n is less than or equal to the number of banks 11. The value of n can be flexibly configured according to the amount of data required for performing a computation task.

In some embodiments, the write address received by data write circuit 13 may include an addressing address and a chip select address. For example, the chip select address may be the most significant bit of the write address, and the addressing address may consist of bits other than the most significant bit of the write address.

In the case where the write control signal corresponds to the first write mode, the data write circuit 13 may be configured to write the first data required for performing the computation task in parallel to the n banks 11 based on the addressing address, so that a corresponding piece of data is stored at the addressing address of each of the n banks 11.

For example, in the case where the write control signal corresponds to the first write mode, the data write circuit 13 may generate n write enable signals and send the n write enable signals to the n banks 11 in a one-to-one correspondence, and in the case where the n banks 11 are enabled to write, the data write circuit 13 may write the first data required for performing the computation task in parallel to the n banks 11 based on the addressing address among the write addresses.

In some cases, the write control signals received by the data write circuit 13 may correspond to other write modes. The manner in which the data write circuit 13 writes data may be different in different write modes. This will be described later.

In the above-described embodiments, the streaming-based data buffer may write a plurality of different pieces of data required for performing a computation task in parallel to a plurality of banks based on one write address, improving the efficiency of data writing and thus improving the efficiency of data processing.

In some embodiments, the data write circuit 13 may be further configured to determine one bank 11 from the plurality of banks 11 based on the chip select address, and to write second data required for performing the computation task to the one bank 11 based on the addressing address, in the case the write control signal corresponds to the second write mode.

For example, in the case the write control signal corresponds to the second write mode, the data write circuit 13 may generate a write enable signal and send the write enable signal to this bank 11. In the case this bank 11 is enabled to write, the data write circuit 13 may write the second data for performing the computation task into this bank 11 on the basis of the addressing address in the write address.

In this manner, the streaming-based data buffer may not only support a write mode in which a plurality of different pieces of data required for performing a computation task are written to a plurality of banks in parallel, but may also support a write mode in which only one piece of the plurality of different pieces of data is written to one bank, further improving the versatility of the streaming-based data buffer.

Figure 3:
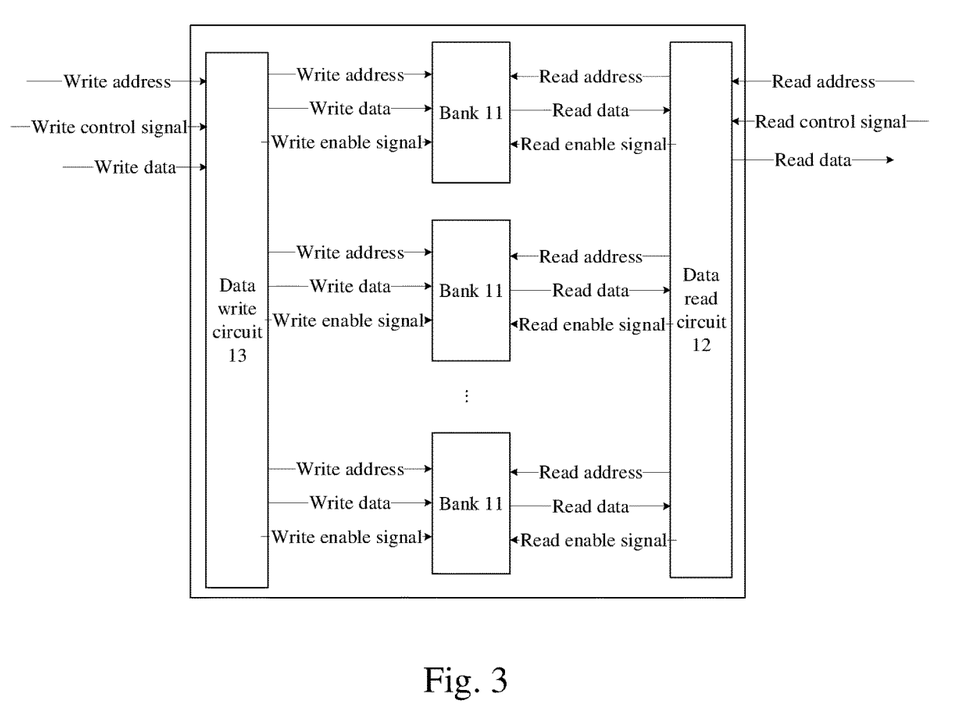
FIG. 3 is a schematic diagram of the structure of a streaming-based data buffer according to yet further embodiments of the present disclosure.

FIG. 3 is a schematic diagram of the structure of a streaming-based data buffer according to yet further embodiments of the present disclosure.

As shown in FIG. 3, the streaming-based data buffer 300 may include a plurality of banks 11, a data read circuit 12, and a data write circuit 13.

A detailed description of the plurality of banks 11, the data read circuit 12 and the data write circuit 13 can be referred to the related embodiments of the streaming-based data buffer 100/200 described above and will not be described in detail herein.

In this manner, the streaming-based data buffer may not only write a plurality of different pieces of data required for performing the computation task in parallel to a plurality of banks based on one write address, but also read a plurality of different pieces of data needed to perform the computation task in parallel from a plurality of banks based on one read address. Thus, not only the efficiency of data writing but also the efficiency of data reading is improved, thereby further improving the efficiency of data processing.

In some embodiments, the streaming-based data buffer may support not only a plurality of write modes but also a plurality of read modes, further improving the versatility of the streaming-based data buffer.

In some embodiments, in the case the computation task is a convolution, the read control signal received by the data read circuit 12 may correspond to a first read mode. In this manner, the data reading efficiency during the operation of the convolution can be improved, thereby improving the data processing efficiency during the operation of the convolution.

In some embodiments, in the case the computation task is a convolution, the write control signal received by the data write circuit 13 may correspond to the first write mode. In this manner, the data writing efficiency during the operation of the convolution can be improved, thereby improving the data processing efficiency during the operation of the convolution.

In some embodiments, the computation task may be a standard convolution, a depth separable convolution, or a bilinear interpolation in a neural network algorithm. In the case the computation task is a different type of computation is described separately below in connection with some embodiments.

Firstly, the case that the computation task is standard convolution in neural network algorithm is introduced.

In some embodiments, in the case the computation task is a standard convolution in a neural network algorithm, the read control signal received by the data read circuit 12 may correspond to the first read mode.

In some embodiments, in the case the computation task is a standard convolution in a neural network algorithm, the write control signal received by the data write circuit 13 may correspond to the first write mode.

In some embodiments, each of the n pieces of data written to the n banks 11 (or read from each of the n pieces of data read from the n banks 11) may include a part of data in a convolution kernel. For example, the convolution kernel is a matrix of w (rows)×h (columns)×c (channels), each piece of data (i.e. part of the data in the convolution kernel) can be a matrix of 1 (rows)×1 (columns)×p (channels), p is the number of elements which can be stored at most in the storage space corresponding to the addressing address, w≥1, h≥1, p≥1, c≥1, and w, h, p and c are all positive integers.

For ease of understanding, the first write mode and the first read mode are described below in connection with the embodiment shown in FIG. 4. FIGS. 4A and 4B are data processing schematics of a standard convolution according to some embodiments of the present disclosure.

Figure 4A:
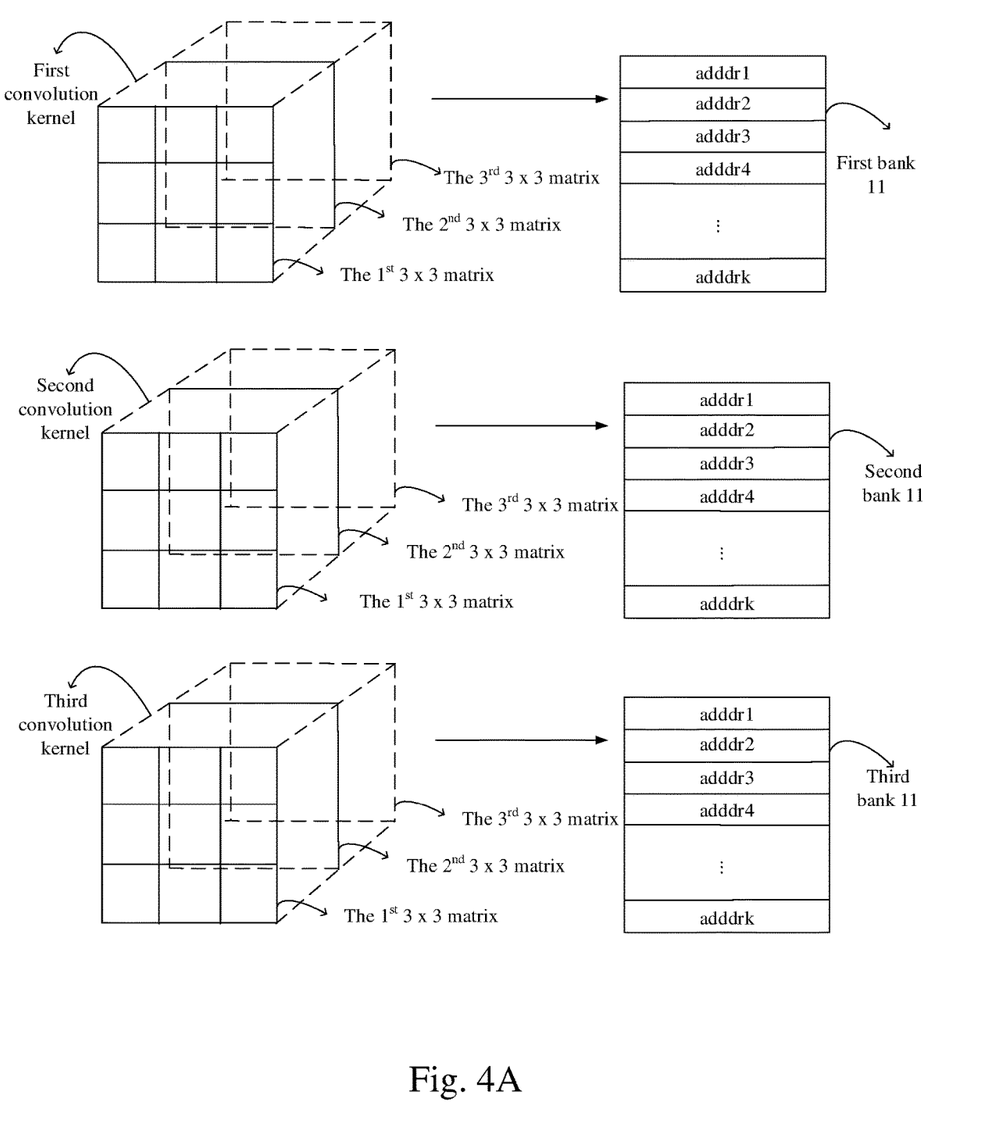
FIGS. 4A and 4B are data processing schematics of a standard convolution according to some embodiments of the present disclosure.

As shown in FIG. 4A, FIG. 4A schematically shows three convolution kernels and three banks 11. Each convolution kernel is a matrix of 3×3×3, i.e. comprises three 3×3 matrices. The addressing address (e.g. addr1-addrk, k≥1 shown in FIG. 4A) corresponding to the storage space at the same position in each storage volume 11 is the same.

In the first write mode, the data write circuit 13 may determine three banks 11 according to the write control signal, and write the data in the three convolution kernels to the three banks 11 in a one-to-one correspondence according to the addressing address in the write address, so that the data in the three convolution kernels are stored in the three banks 11 in a one-to-one correspondence.

Figure 4B:
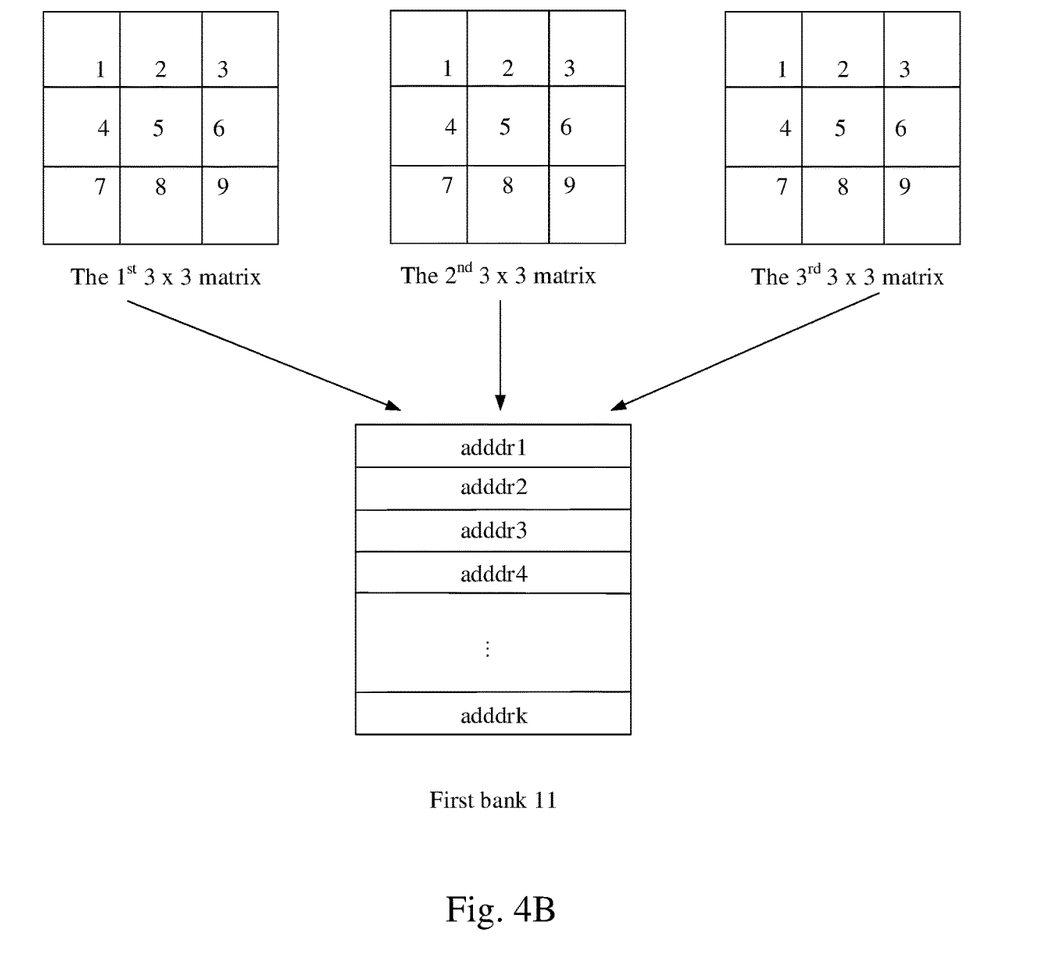

Taking the example of writing the data in the first convolution kernel to the first bank 11, as shown in FIG. 4B, the data in the first convolution kernel includes all the elements in three 3×3 matrices. For convenience of description, nine positions corresponding one-to-one to nine elements in each 3×3 matrix are denoted by numerals 1-9.

As some implementations, three elements corresponding to the same position in three 3×3 matrices of the first convolution kernel (i.e. a matrix of 1×1×3) can be used as one piece of data, and all the elements of the first convolution kernel can be written into the corresponding first bank 11 in the order of row by row and then column by column.

For example, the data write circuit 13 can first write three elements corresponding to a first row and a first column (namely, the position of numerical 1) in each 3×3 matrix as one piece of data into a storage space corresponding to an addressing address addr1 of the first bank 11; then write three elements corresponding to a first row and a second column (namely, the position of numerical 2) in each 3×3 matrix as one piece of data into a storage space corresponding to an addressing address addr2 of the first bank 11; next, write three elements corresponding to a first row and a third column (namely, the position of numerical 3) in each 3×3 matrix as one piece of data into a storage space corresponding to an addressing address addr3 of the first bank 11. Thus, all elements corresponding to the first row of each 3×3 matrix can be written into the first bank 11.

Similarly, afterward three elements corresponding to the position of numerical 4 in each 3×3 matrix can be written as one piece of data into the storage space corresponding to the addressing address addr4 of the first bank 11. Analogizing in this order until all the elements of the three 3×3 matrices are written into the first bank 11.

Since p is the number of elements which can be stored at most in a storage space corresponding to an addressing address, if p c and c is an integer multiple of p, then p elements (namely, a piece of data) in c elements corresponding to one position can be written in each time until c elements corresponding to the position are all written in, and then c elements corresponding to the next position are written; if p<c and c is not an integer multiple of p, after performing [c/p] (i.e. rounding c/p) times of writing, the number of the last remaining elements is less than p, then when writing the remaining elements, the excess storage space can be selected to write 0 to fill or to be empty; if p>c, then the additional storage space after writing c elements corresponding to one position can also be selected to write 0 to fill or to be empty.

It should be noted that, in view of the fact that the position of the data in the convolution kernel needs to maintain a strict correspondence with the position of the data in the feature map during the convolution, with respect to continuing to store the data at another position in the excess part of the storage space corresponding to one addressing address, the method of selecting empty or writing 0 can avoid the need to separate the data read from one addressing address according to the position of the data before outputting the data to the calculation circuit for performing the calculation subsequently, thus reducing the complexity of data processing.

It should be understood that, since the storage space of the same position in each bank 11 corresponds to the same addressing address, part of the data in the first convolution kernel (i.e. one piece of data, e.g. three elements corresponding to the position of numerical 1 of each 3×3 matrix in the first convolution kernel) is written into the storage space corresponding to the addressing address (e.g. addr1) of the first bank 11, the data write circuit 13 can write part of the data in the second convolution kernel (namely, another piece of data, for example, 3 elements corresponding to the position of numerical 1 of each 3×3 matrix in the second convolution kernel) in parallel into a storage space corresponding to the addressing address (for example, addr1) of the second storage bank 11, so that in the first write mode, the data write circuit 13 can write a plurality of pieces of data in parallel into a plurality of storage banks 11 corresponding to one-to-one only by receiving one writing address.

In the first read mode, the data read circuit 12 may determine the three banks 11 storing the data in the three convolution kernels according to the read control signal and read the data in the three convolution kernels from the three banks 11 according to the addressing address in the read address. For example, for one read, the data read circuit 12 may read 3 pieces of data of the three convolution kernels in parallel from three banks 11 according to the addressing address addr1, wherein each piece of data may comprise part of the data in one convolution kernel (e.g. three elements corresponding to the position of numeral 1 in the three 3×3 matrices of the first convolution kernel).

Next, in the case the computation task is depth separable convolution in neural network algorithm is introduced.

In some embodiments, in the case the computation task is a depth separable convolution in a neural network algorithm, the read control signal received by the data read circuit 12 may correspond to the first read mode.

In some embodiments, in the case the computation task is a depth separable convolution in a neural network algorithm, the write control signal received by the data write circuit 13 may correspond to the first write mode.

In some embodiments, each of the n pieces of data written to the n banks 11 (or read from each of the n pieces of data read from the n banks 11) may include a part of data in a feature map of one channel. For example, a channel may be characterized as a matrix of w (row)×h (column), and each piece of data may be a matrix of 1 (row)×p (column) or a matrix of p (row)×1 (column).

Figure 5:
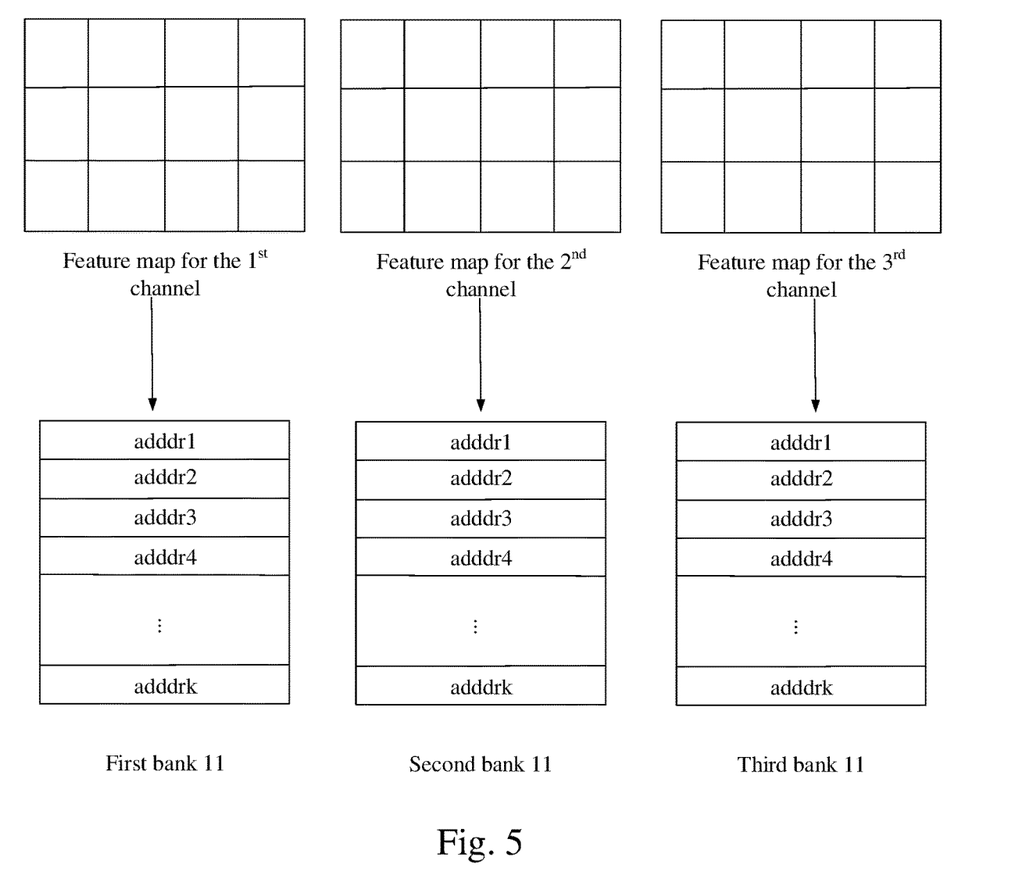
FIG. 5 is a data processing diagram of a depth separable convolution according to some embodiments of the present disclosure.

For ease of understanding, the first write mode and the first read mode are described below in connection with the embodiment shown in FIG. 5. FIG. 5 is a data processing diagram of a depth separable convolution according to some embodiments of the present disclosure.

As shown in FIG. 5, FIG. 5 schematically shows a feature map of three channels and three banks 11. The feature map for each channel is a 3×4 matrix, and the data in the feature map for each channel includes all elements in the 3×4 matrix. The addressing address (e.g. addr1-addrk, k≥1 shown in FIG. 5) corresponding to the storage space at the same position in each storage volume 11 is the same.

In the first write mode, the data write circuit 13 may determine three banks 11 according to the write control signal, and write the data in the feature map of the three channels to the three banks 11 in a one-to-one correspondence according to the addressing address in the write address, so that the data in the feature map of the three channels are stored in the three banks 11 in a one-to-one correspondence.

As some implementations, for feature map of each channel (i.e. each 3×4 matrix), the data in the feature map of the channel (i.e. the 3×4 elements) may all be written into a corresponding one of the banks 11 in a row-by-row and then column-by-column order. In this manner, each piece of data may be a matrix of 1 (row)×p (column).

Taking writing data in the feature map of the first channel into the first bank 11 as an example, the data write circuit 13 can first write four elements of the first row in the first 3×4 matrix as one piece of data into a storage space corresponding to the addressing address addr1 of the first bank 11; then the four elements of the second row in the matrix can be written as one piece of data into a storage space corresponding to the addressing address addr2 of the first bank 11; finally, the four elements of the third row of the matrix are written as one piece of data into the storage space corresponding to the addressing address addr3 of the first bank 11. In this manner, all 3×4 elements of the first 3×4 matrix can be written into the first bank 11.

Similarly, since p is the number of elements which can be stored at most in a storage space corresponding to an addressing address, in this manner, if p h and h is an integer multiple of p, then p elements (namely, a piece of data) in h elements corresponding to one row can be written in each time until h elements corresponding to the row are all written in, and then h elements corresponding to the next position are written; if p<h and h is not an integer multiple of p, after performing [h/p] (i.e. rounding h/p) times of writing, the number of the last remaining elements is less than p, then when writing the remaining elements, the excess storage space can be selected to write 0 to fill or to be empty; if p>h, then the additional storage space after writing h elements corresponding to one row can also be selected to write 0 to fill or to be empty.

It should be understood that since the storage space at the same position in each bank 11 correspond to the same addressing address, in the process of writing the 4 elements of the first row in the first 3×4 matrix as one piece of data into the storage space corresponding to the addressing address addr1 of the first bank 11, the data write circuit 13 can write the 4 elements of the first row in the second 3×4 matrix as another piece of data into the storage space corresponding to the addressing address addr1 of the second bank 11 in parallel, so that in the first write mode, the data write circuit 13 can write a plurality of pieces of data in parallel into a plurality of banks 11 corresponding to one-to-one only by receiving one write address.

In the first read mode, the data read circuit 12 may determine the three banks 11 storing the data in the feature map of the three channels according to the read control signal and read the data in the feature map of the three channels from the three banks 11 according to the addressing address in the read address. For example, for one read, the data read circuit 12 may read three pieces of data in the feature map of three channels in parallel from three banks 11 according to the addressing address addr1, wherein each piece of data may comprise part of the data in the feature map of each channel (e.g. the elements of the first row).

The following describes the case where the computation task is bilinear interpolation in neural network algorithms.

In some embodiments, in the case the computation task is a bilinear interpolation in a neural network algorithm, the read control signal received by the data read circuit 12 may correspond to a second read mode.

In some embodiments, in the case the computation task is a bilinear interpolation in a neural network algorithm, the write control signal received by the data write circuit 13 may correspond to the second write mode. For example, the bank 11 determined by the data write circuit 13 according to the chip select address in the received write address may be the first bank 11, and according to the addressing address addr1 in the write address, the data write circuit 13 may write a parameter required for performing the bilinear interpolation into a storage space corresponding to the addressing address addr1 of the first bank 11.

Figure 6:
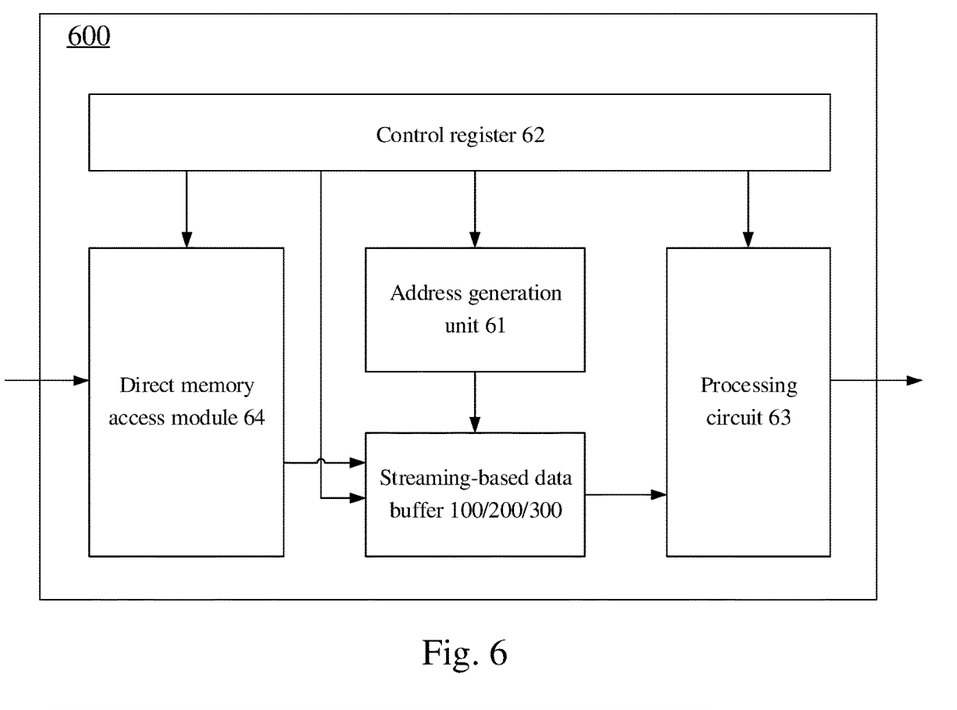
FIG. 6 is a schematic diagram of a structure of an artificial intelligence chip according to some embodiments of the present disclosure.

FIG. 6 is a schematic diagram of a structure of an artificial intelligence chip according to some embodiments of the present disclosure.

As shown in FIG. 6, artificial intelligence chip 600 may include a streaming-based data buffer (e.g. streaming-based data buffer 100/200/300), an address generation unit (AGU) 61, and a control register (CSR) 62 of any of the embodiments described above.

In the case where the artificial intelligence chip 600 includes the data buffer 100/300, the address generation unit 61 may be configured to generate a read address and send the read address to the data buffer 100/300 in response to the first drive signal corresponding to the computation task. The control register 62 may be configured to send a read control signal to the data buffer 100/300 and a first drive signal to the address generation unit 61 in response to a first configuration signal corresponding to the computation task.

In some embodiments, the artificial intelligence chip 600 may also include processing circuit 63. The processing circuit 63 may be configured to send a plurality of pieces of data of the n pieces of data to a calculation circuit in response to a second drive signal corresponding to the computation task sent by the control register 62. For example, in the case three pieces of data are required for the computation circuit to perform the computation task, the processing circuit 63 may be configured to extract three pieces of data from the six pieces of data output from the data buffer 100/200 and send to the computation circuit in response to the second drive signal corresponding to the computation task sent by the control register 62.

In the case where the artificial intelligence chip 600 includes the data buffer 200/300, the address generation unit 61 may be configured to generate a write address and send the write address to the data buffer 200/300 in response to the third drive signal corresponding to the computation task; the control register 62 may be configured to send a write control signal to the data buffer 200/300 and a third drive signal to the address generation unit 61 in response to the second configuration signal corresponding to the computation task.

In some embodiments, artificial intelligence chip 600 may also include a direct memory access module (Direct Memory Access, DMA) 64. The direct memory access module 64 may be configured to obtain data required for performing the computation task from an off-chip memory in response to a fourth drive signal corresponding to the computation task sent by the control register 62. In this case, the data write circuit in the data buffer 200/300 may be configured to obtain the first data from the required data and write the first data to the n banks in parallel.

Embodiments of the present disclosure also provide an accelerator that includes an artificial intelligence chip (e.g. artificial intelligence chip 600) of any of the embodiments described above.

Streaming-based data processing methods according to some embodiments of the present disclosure are described below in conjunction with FIGS. 7-8.

Figure 7:
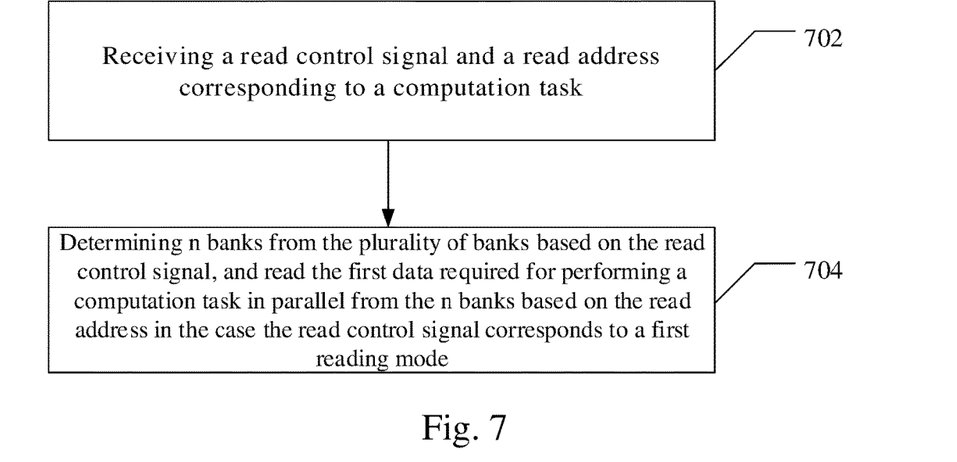
FIG. 7 is a flow diagram of a streaming-based data processing method according to some embodiments of the present disclosure.

FIG. 7 is a flow diagram of a streaming-based data processing method according to some embodiments of the present disclosure.

At step 702, a read control signal and a read address corresponding to a computation task are received.

At step 704, in a case where the read control signal corresponds to the first read mode, n banks are determined from the plurality of banks based on the read control signal, and first data required for performing a computation task is read in parallel from the n banks based on the read address.

Here, different data may be stored in different banks of the plurality of banks, the first data may comprise n pieces of data corresponding to n banks in a one-to-one correspondence, n≥2, and n is a positive integer.

In some embodiments, the read address may include an addressing address and a chip select address. In this case, the first data required for performing the computation task can be read in parallel from the n banks based on the addressing address in the read address.

In some embodiments, the method shown in FIG. 7 may further comprise the steps of: in the case the read control signal corresponds to a second read mode, determining one bank from the plurality of banks based on the chip select address in the read address and read a second data required for performing the computation task from the one bank based on the addressing address in the read address.

In some embodiments, the steps in the method of FIG. 7 may be performed using the streaming-based data buffers 100/300 described above.

A detailed description of the method shown in FIG. 7 can be made with reference to the related embodiments of the streaming-based data buffer shown in FIGS. 1 and 3, and will not be described in detail herein.

Figure 8:
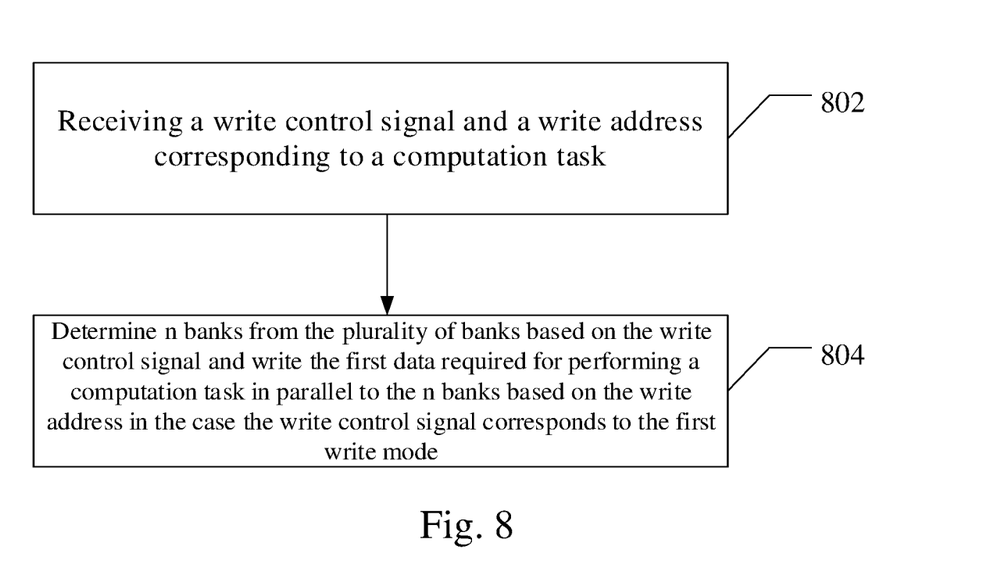
FIG. 8 is a flow diagram of a streaming-based data processing method according to further embodiments of the present disclosure.

FIG. 8 is a flow diagram of a streaming-based data processing method according to further embodiments of the present disclosure.

In step 802, a write control signal and a write address corresponding to a computation task are received.

In step 804, in a case where the write control signal corresponds to the first write mode, n banks are determined from the plurality of banks based on the write control signal, and first data required for performing the computation task is written in parallel to the n banks based on the write address.

Here, different data may be stored in different banks of the plurality of banks, the first data may comprise n pieces of data corresponding to n banks in a one-to-one correspondence, n≥2, and n is a positive integer.

In some embodiments, the write address may include an addressing address and a chip select address. In this case, the first data required for performing the computation task may be written in parallel to the n banks based on the addressing address among the write addresses.

In some embodiments, the method shown in FIG. 8 may further comprise the steps of: in the case where the write control signal corresponds to the second write mode, one bank is determined from the plurality of banks based on the chip select address in the write address, and the second data required for performing the computation task is written to one bank based on the addressing address in the write address.

In some embodiments, the steps in the method of FIG. 8 may be performed using the streaming-based data buffers 200/300 described above.

A detailed description of the method shown in FIG. 7 can be made with reference to the related embodiments of the streaming-based data buffer shown in FIGS. 2 and 3, and will not be described in detail herein.

In some embodiments, the data processing method may include steps 702 and 704 shown in FIG. 7, and steps 802 and 804 shown in FIG. 8.

Thus far, various embodiments of the present disclosure have been described in detail. To avoid obscuring the concepts of the present disclosure, some details known in the art are not described. From the above description, those skilled in the art will fully understand how to implement the technical solutions disclosed herein.

While specific embodiments of the disclosure have been described in detail by way of example, it will be understood by those skilled in the art that the foregoing examples are illustrative only and are not intended to limit the scope of the disclosure. It will be appreciated by those skilled in the art that changes may be made to the above embodiments or equivalents may be substituted for elements thereof without departing from the scope and spirit of the disclosure. The scope of the disclosure is defined by the appended claims.

The invention claimed is:

1. A streaming-based data buffer comprising:
    a plurality of banks, different banks being configured to store different data;
    a data read circuit configured to receive a read control signal and a read address corresponding to a computation task, in the case the read control signal corresponds to a first read mode, determine n banks from the plurality of banks based on the read control signal, and read a first data required for performing the computation task in parallel from the n banks based on the read address, the first data comprising n pieces of data corresponding to the n banks in a one-to-one correspondence, n≥2, n being a positive integer;
    wherein the read address comprises an addressing address and a chip select address, the data read circuit is configured to read the first data based on the addressing address;
    the data read circuit is further configured to, in the case the read control signal corresponds to a second read mode, determine one bank from the plurality of banks based on the chip select address and read a second data required for performing the computation task from the one bank based on the addressing address; and
    the read control signal corresponds to the second read mode in the case the computation task is a bilinear interpolation in the neural network algorithm.

2. The data buffer of claim 1, wherein the read control signal corresponds to the first read mode in the case the computation task is a convolution.

3. The data buffer of claim 2, wherein in the case the computation task is a standard convolution in a neural network algorithm, each piece of the data comprises part of the data in one convolution kernel.

4. The data buffer of claim 2, wherein in the case the computation task is a depth separable convolution in the neural network algorithm, each piece of the data comprises part of data in a feature map of one channel.

5. The data buffer of claim 1, further comprising:
a data write circuit configured to receive a write control signal and a write address corresponding to the computation task, determine the n banks based on the write control signal and write the first data in parallel to the n banks based on the write address in the case the write control signal corresponds to a first write mode.

6. A streaming-based data processing method, comprising:
using the data buffer of claim 1, wherein the data read circuit of the data buffer:
receiving a read control signal and a read address corresponding to a computation task;
in the case the read control signal corresponds to a first read mode, determining n banks from the plurality of banks based on the read control signal, and reading a first data required for performing the computation task in parallel from the n banks based on the read address, different data being stored in different banks of the plurality of banks, the first data comprising n pieces of data corresponding to the n banks in a one-to-one correspondence, n≥2, n being a positive integer.

7. The streaming-based data processing method of claim 6, wherein the read address comprises an addressing address and a chip select address, and the reading the first data required for performing the computation task from the n banks in parallel based on the read address comprises:
reading the first data based on the addressing address.

8. The streaming-based data processing method of claim 7, further comprising:
in the case the read control signal corresponds to a second read mode, determining one bank from the plurality of banks based on the chip select address and read a second data required for performing the computation task from the one bank based on the addressing address.

9. The streaming-based data processing method of claim 6, further comprising:
receiving a write control signal and a write address corresponding to the computation task;
determining the n banks based on the write control signal and write the first data in parallel to the n banks based on the write address in the case the write control signal corresponds to a first write mode.

10. An artificial intelligence chip comprising:
the streaming-based data buffer of claim 1;
an address generation unit configured to generate the read address and send the read address to the data buffer in response to a first drive signal corresponding to the computation task; and
a control register configured to send the read control signal to the data buffer and send the first drive signal to the address generation unit in response to a first configuration signal corresponding to the computation task.

* * * * *